United States Patent
Hirakawa et al.

(10) Patent No.: US 10,160,015 B2
(45) Date of Patent: Dec. 25, 2018

(54) FOREIGN SUBSTANCE REMOVAL APPARATUS AND FOREIGN SUBSTANCE DETECTION APPARATUS

(71) Applicant: TOKYO ELECTRON LIMITED, Tokyo (JP)

(72) Inventors: Osamu Hirakawa, Koshi (JP); Yoshitaka Otsuka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 115 days.

(21) Appl. No.: 15/089,680

(22) Filed: Apr. 4, 2016

(65) Prior Publication Data

US 2016/0296982 A1 Oct. 13, 2016

(30) Foreign Application Priority Data

Apr. 9, 2015 (JP) ................... 2015-080375
Apr. 9, 2015 (JP) ................... 2015-080376
Apr. 9, 2015 (JP) ................... 2015-080407

(51) Int. Cl.
| | |
|---|---|
| *B08B 3/02* | (2006.01) |
| *B08B 5/02* | (2006.01) |
| *B08B 7/04* | (2006.01) |
| *B08B 13/00* | (2006.01) |
| *B08B 15/04* | (2006.01) |
| *H01L 21/67* | (2006.01) |
| *B08B 5/04* | (2006.01) |

(52) U.S. Cl.
CPC .................. *B08B 7/04* (2013.01); *B08B 3/02* (2013.01); *B08B 5/02* (2013.01); *B08B 5/04* (2013.01); *B08B 13/00* (2013.01); *H01L 21/67028* (2013.01); *H01L 21/67253* (2013.01); *H01L 21/67288* (2013.01); *B08B 15/04* (2013.01); *B08B 2203/0229* (2013.01)

(58) Field of Classification Search
CPC ........... H01L 21/6838; H01L 21/68714; H01L 21/67288
See application file for complete search history.

(56) References Cited

U.S. PATENT DOCUMENTS

2005/0000540 A1* 1/2005 Uziel .................... B08B 7/0035
    134/1
2010/0081096 A1* 4/2010 Itai ....................... G03F 7/70508
    430/325

FOREIGN PATENT DOCUMENTS

| JP | 61-208051 A | 9/1986 |
|---|---|---|
| JP | 6473203 A | 3/1989 |
| JP | 7325041 A | 12/1995 |
| JP | 8-57438 A | 3/1996 |
| JP | 10128634 A | 5/1998 |
| JP | 11-307492 A | 11/1999 |
| JP | 2000124122 A | 4/2000 |
| JP | 2005093854 A | 4/2005 |

(Continued)

*Primary Examiner* — Spencer E Bell
(74) *Attorney, Agent, or Firm* — Nath, Goldberg & Meyer; Jerald L. Meyer

(57) ABSTRACT

An apparatus for removing at least one foreign substance includes a detection unit detecting the at least one foreign substance adhered to a holding surface of a suction holding unit configured to suck and hold a substrate, a removal unit removing the at least one foreign substance adhered to the holding surface using fluid, and a movement mechanism configured to move the detection unit and the removal unit.

4 Claims, 22 Drawing Sheets

(56) References Cited

FOREIGN PATENT DOCUMENTS

| | | |
|---|---|---|
| JP | 2009297859 A | 12/2009 |
| JP | 2014-165281 A | 9/2014 |
| TW | 200823967 A | 6/2008 |
| TW | 201200866 A1 | 1/2012 |
| TW | 201442061 A | 11/2014 |
| TW | 200607578 A | 12/2014 |
| TW | 201448019 A | 12/2014 |
| WO | 2008105460 A1 | 9/2008 |

* cited by examiner

FOREIGN SUBSTANCE REMOVAL APPARATUS AND FOREIGN SUBSTANCE DETECTION APPARATUS

CROSS-REFERENCE TO RELATED APPLICATIONS

This application claims the benefit of Japanese Patent Application Nos. 2015-080407, 2015-080375, and 2015-080376, all filed on Apr. 9, 2015, in the Japan Patent Office, the disclosures of which are incorporated herein in their entirety by reference.

TECHNICAL FIELD

The present disclosure relates to a foreign substance removal apparatus and a foreign substance detection apparatus.

BACKGROUND

In the processes of manufacturing semiconductor devices, semiconductor substrates such as silicon wafers or compound semiconductor wafers have recently tended to have large diameters and become thin. A thin semiconductor substrate having a large diameter may be bent or broken when it is transported or ground. For this reason, after a support substrate is bonded to a semiconductor substrate for supporting the semiconductor substrate, a transportation or grinding process for TSV (Through-silicon via) process is performed on the bonded semiconductor substrate, and then the support substrate is separated from the semiconductor substrate.

For example, there is known a technique in which a semiconductor substrate is held using a first holding part while a support substrate is held using a second holding part, and the support substrate is separated from the semiconductor substrate by moving the second holding part in the direction in which the second holding part is separated from the semiconductor substrate.

Here, a suction holding part such as a porous chuck is used as the first holding part for holding the semiconductor substrate, for example.

However, if foreign substances are adhered to the holding surface of the suction holding part when the semiconductor substrate is held in the suction holding part, defects such as breakage may be caused since stress is applied to the semiconductor substrate due to the foreign substances.

In addition, the above defects are not limited to the case where the support substrate is separated from the semiconductor substrate, but may occur when the semiconductor substrate is held by the suction holding part in the semiconductor manufacturing device.

SUMMARY

Some embodiments of the present disclosure provide to a foreign substance removal apparatus and method, and a separation apparatus, which are capable of removing foreign substances adhered to a holding surface of a suction holding unit.

According to the present disclosure, there is provided an apparatus for removing at least one foreign substance including a detection unit detecting the at least one foreign substance adhered to a holding surface of a suction holding unit configured to suck and hold a substrate, a removal unit removing the at least one foreign substance adhered to the holding surface using fluid, and a movement mechanism configured to move the detection unit and the removal unit.

According to the present disclosure, there is provided an apparatus for removing at least one foreign substance, including an ejection part ejecting a fluid to a holding surface of a suction holding unit configured to suck and hold a substrate, and a suction part disposed adjacent to the ejection part so as to suck the fluid.

According to the present disclosure, there is provided an apparatus for detecting at least one foreign substance, including a light projecting part irradiating a holding surface of a suction holding unit, configured to suck and hold a substrate, with light in a direction inclined to the holding surface, and a light receiving part receiving a reflection light of the light, emitted to the holding surface, from a direction inclined to the holding surface.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. The present disclosure is not limited to the embodiments described below.

First Embodiment

Overall Configuration of Foreign Substance Removal Apparatus

Figure 1:
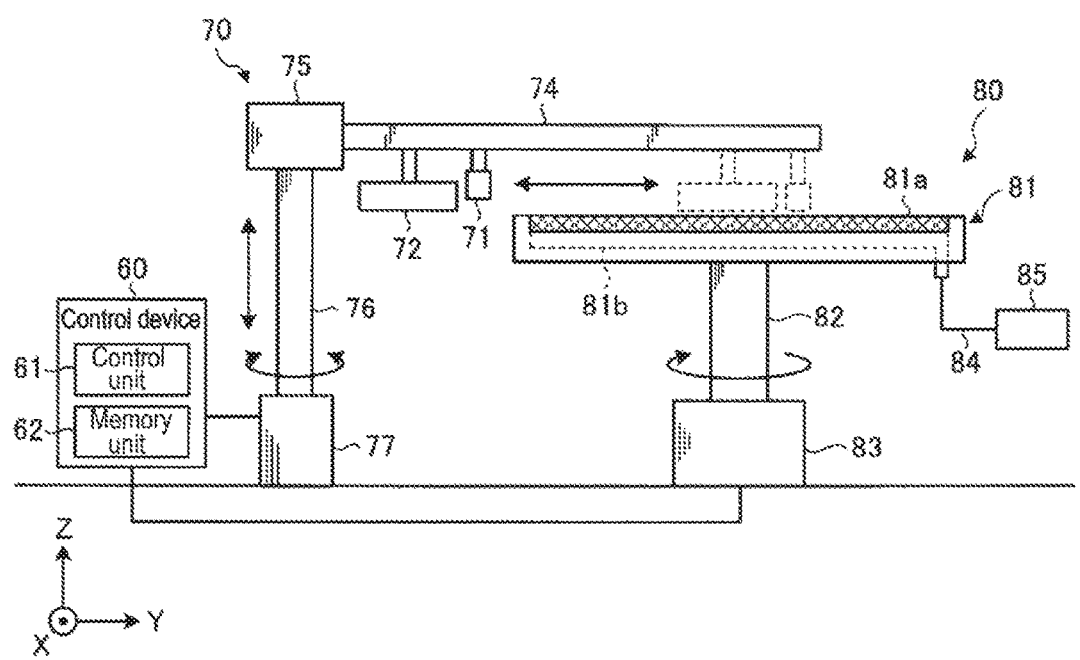
FIG. 1 is a side view schematically illustrating a configuration of a foreign substance removal apparatus according to a first embodiment.
Figure 2:
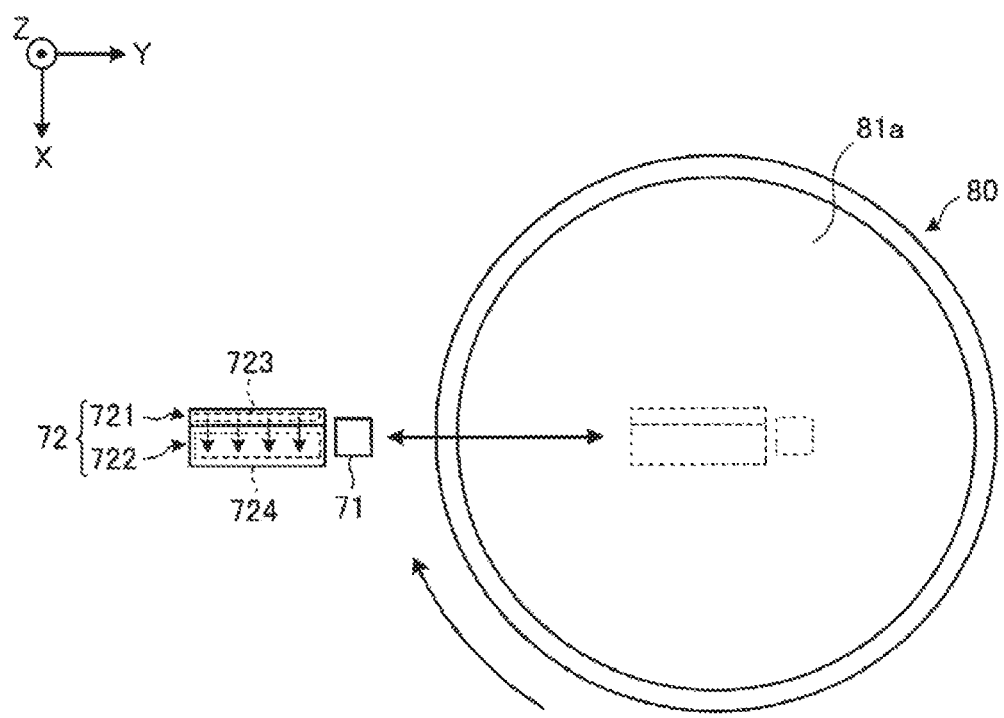
FIG. 2 is a top view schematically illustrating the configuration of the foreign substance removal apparatus according to the first embodiment.

First, the overall configuration of a foreign substance removal apparatus according to a first embodiment will be described with reference to FIGS. 1 and 2. FIG. 1 is a side view schematically illustrating the configuration of the foreign substance removal apparatus according to the first embodiment. FIG. 2 is a top view schematically illustrating the configuration of the foreign substance removal apparatus according to the first embodiment. In the embodiments, in order to clarify a positional relationship, an X-axis direction, a Y-axis direction, and a Z-axis direction which are orthogonal to each other are defined, and the positive Z-axis direction refers to an upward vertical direction.

The foreign substance removal apparatus, which is designated by reference numeral 70, illustrated in FIG. 1 detects and removes foreign substances adhered to the holding surface of a suction holding unit 80 which sucks and holds a semiconductor substrate (hereinafter, referred to as a "substrate").

The suction holding unit 80 is, e.g., a porous chuck, and includes a body part 81, a post member 82, and a rotary mechanism 83.

The body part 81 includes a suction pad 81a. The suction pad 81a has a diameter equal to or slightly greater than the substrate, and substantially comes into contact with the whole lower surface of the substrate. For example, the suction pad 81a is made of silicon carbide or a porous body such as a porous ceramic or a porous Teflon (registered trademark).

The body part 81 has a suction space 81b which is defined therein to communicate with the outside through the suction pad 81a. The suction space 81b is connected to an intake device 85, such as a vacuum pump, through an intake pipe 84. The suction holding unit 80 keeps the substrate on the suction pad 81a using negative pressure generated by intaking the air in the intake device 85.

The post member 82 is a member extending in the vertical direction, and supports the body part 81 at the tip thereof. The rotary mechanism 83 rotates the post member 82 around the vertical axis thereof. Accordingly, the body part 81 supported by the post member 82 rotates integrally.

The foreign substance removal apparatus 70 includes a detection unit 71 which detects foreign substances on the suction pad 81a, and a removal unit 72 which removes foreign substances on the suction pad 81a.

As illustrated in FIG. 2, the removal unit 72 includes an ejection part 721 and a suction part 722. The ejection part 721 ejects fluid to the suction pad 81a of the suction holding unit 80 from an ejection port 723. In addition, the suction part 722 is disposed adjacent to the ejection part 721, and sucks the fluid ejected from the ejection part 721 through a suction port 724. The specific configurations of the detection unit 71 and the removal unit 72 will be described below.

The foreign substance removal apparatus 70 includes a support member 74, a movement mechanism 75, a post member 76, and a rotary elevation mechanism 77. The support member 74 extends in the horizontal direction, and supports the detection unit 71 and the removal unit 72 from above.

The movement mechanism 75 is installed, for example, at the base end of the support member 74, and linearly moves the detection unit 71 and the removal unit 72 along a rail (not shown) installed at the support member 74.

The post member 76 extends in the vertical direction, and supports the movement mechanism 75 at the tip thereof. The rotary elevation mechanism 77 rotates the post member 76 around the vertical axis thereof. In addition, the rotary elevation mechanism 77 lifts or drops the post member 76 in the vertical direction.

The foreign substance removal apparatus 70 and the suction holding unit 80 are connected to a control device 60. The control device 60 is, e.g., a computer, and includes a control unit 61 and a memory unit 62. The memory unit 62 stores programs for controlling various types of processing executed in the foreign substance removal apparatus 70 and the suction holding unit 80. The control unit 61 is, e.g., a CPU (Central Processing Unit), and controls the operations of the foreign substance removal apparatus 70 and the suction holding unit 80 by reading and executing the programs stored in the memory unit 62.

These programs are recorded in a computer-readable storage medium, and may be installed to the memory unit 62 of the control device 60 from the storage medium. The computer-readable storage medium includes, e.g., a hard disk (HD), a flexible disk (FD), a compact disk (CD), a magnet optical disk (MO), a memory card, etc. In addition, the control unit 61 may be configured by only hardware without using programs.

<Configuration of Detection Unit>

Figure 3:
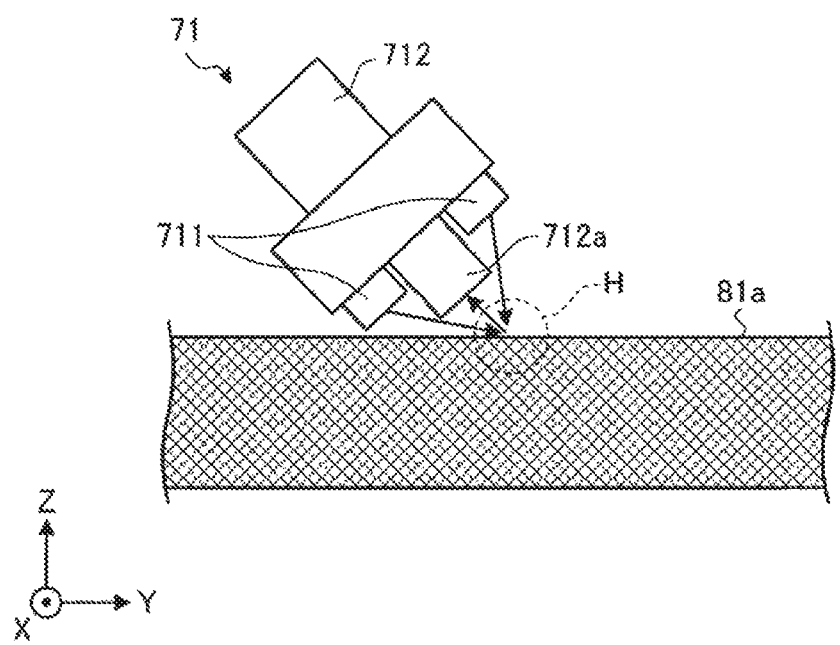
FIG. 3 is a side view schematically illustrating a configuration of a detection unit.
Figure 4:
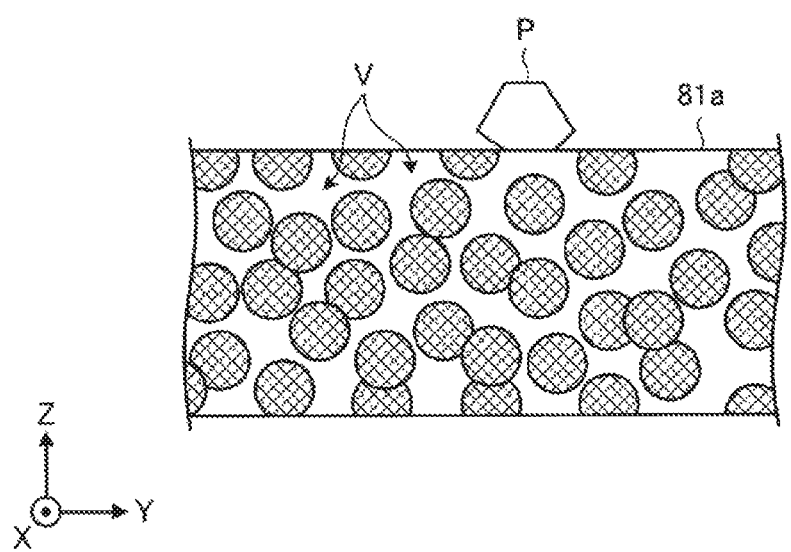
FIG. 4 is a schematic enlarged view of portion "H" illustrated in FIG. 3.

Next, the configuration of the detection unit 71 included in the foreign substance removal apparatus 70 will be described with reference to FIGS. 3 and 4. FIG. 3 is a side view schematically illustrating the configuration of the detection unit 71. FIG. 4 is a schematic enlarged view of portion "H" illustrated in FIG. 3.

As illustrated in FIG. 3, the detection unit 71 includes a light-projecting part 711 and a light receiving part 712. The detection unit 71 is supported by the support member 74 (see FIG. 1) in the state in which the light-projecting part 711 and the light receiving part 712 are inclined to the surface of the suction pad 81a at a predetermined angle.

The light projecting part 711 irradiates the surface of the suction pad 81a with light in a direction inclined thereto. The light projecting part 711 may use, e.g., a ring illumination. The light projecting part 711 as a ring illumination includes a plurality of light emitting devices arranged in an annular form around a lens 712a included in the light receiving part 712. It is possible to uniformly illuminate a detection target region using the light projecting part 711.

The light receiving part 712 is, e.g., a CCD (Charge Coupled Device) camera. The light receiving part 712 is supported in the state in which the optical axis of the lens 712a is inclined to the suction pad 81a at a predetermined angle, and captures an image of a target region on the suction pad 81a by receiving the reflection light of the light emitted to the suction pad 81a from a direction inclined to the suction pad 81a. The image captured by the light receiving part 712 is output to the control unit 61. The control unit 61 detects foreign substances on the suction pad 81a, based on the image acquired from the light receiving part 712.

Here, since the suction pad 81a is a porous body as illustrated in FIG. 4, it has a large number of voids V. Accordingly, when the light is vertically emitted to the suction pad 81a, the light is diffusely reflected due to the voids V and tends to become noise when an image is analyzed. In addition, since the image of a foreign substance P is two-dimensionally captured when it is captured in a direction perpendicular to the suction pad 81a, it is difficult to distinguish the foreign substance P and the porous structure of the suction pad 81a. As such, it is difficult to accurately detect the foreign substance P, which is present on the suction pad 81a that is a porous body, from the illuminating and image-capturing in the direction perpendicular to the suction pad 81a.

In contrast, since the detection unit 71 according to the first embodiment irradiates the suction pad 81a with light in the direction inclined thereto, it is possible to reduce diffuse reflection due to voids V. In addition, since the detection unit 71 according to the first embodiment captures the image of the suction pad 81a in the direction inclined thereto, a foreign substance P having a predetermined height, which is present on the suction pad 81a, is easily distinguished from the porous structure of the suction pad 81a.

Thus, it is possible to very accurately detect the foreign substance P, which is present on the suction pad 81a as a porous body, by the detection unit 71 according to the first embodiment. In addition, the inclination angle of each of the light projecting part 711 and the light receiving part 712 to the suction pad 81a is preferably an angle equal to or less than 45 degrees.

<Configuration of Removal Unit>

Figure 5:
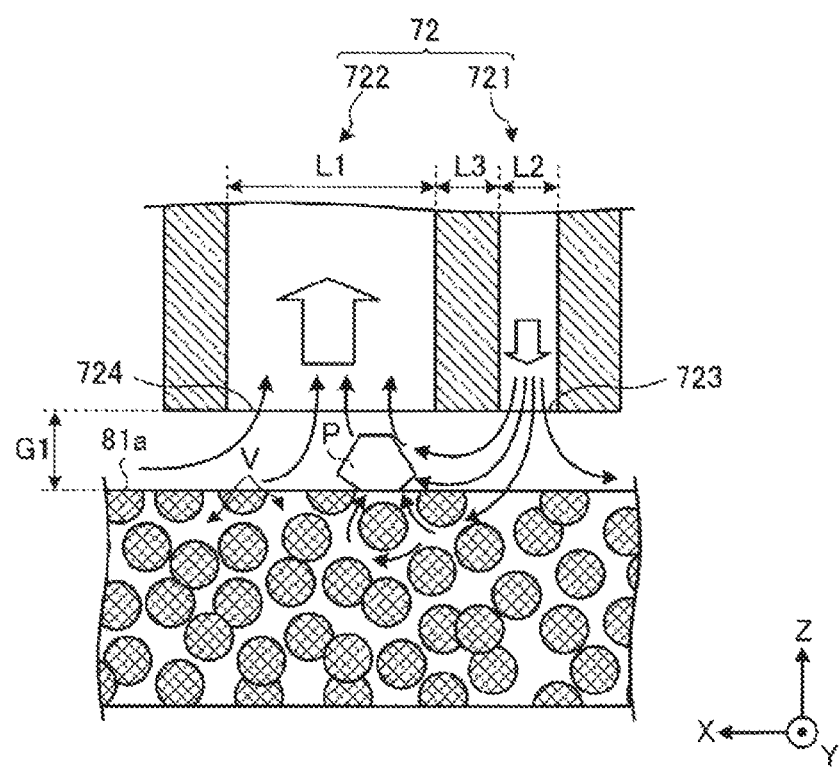
FIG. 5 is a cross-sectional view schematically illustrating a configuration of a removal unit.

Next, the configuration of the removal unit 72 will be described with reference to FIG. 5. FIG. 5 is a cross-sectional view schematically illustrating the configuration of the removal unit 72. As illustrated in FIG. 5, the removal unit 72 includes the ejection part 721 which ejects fluid to the suction pad 81a, and the suction part 722 which sucks the fluid ejected from the ejection part 721.

Here, the method of absorbing foreign substances P using suction force may be considered in order to remove the foreign substances P from the suction pad 81a, but it is difficult for this method to remove the foreign substances P having high adhesion. In addition, a method of blowing foreign substances P by jetting a gas may be considered. However, both methods cannot have high removal efficiency since surroundings may be contaminated by the foreign substances P blown to the surroundings or the foreign substances P may be adhered again to the suction pad 81a.

Accordingly, the removal unit 72 according to the first embodiment removes foreign substances P on the suction pad 81a using a synergy effect of the force of fluid ejected from the ejection part 721 and the suction force by the suction part 722.

Specifically, in the removal unit 72 according to the first embodiment, the ejection part 721 is disposed adjacent to the suction part 722. Thereby, a flow from the ejection part 721 to the suction part 722 may be formed. By such a flow, a force to laterally press the foreign substances P and a force to pump up the foreign substances P may be simultaneously applied. Thus, the foreign substances P may strongly peel from the suction pad 81a. In addition, when only the ejection part 721 is used, foreign substances P may be blown to surroundings. However, since the suction part 722 sucks the foreign substances P, it is possible to prevent the foreign substances P removed from the suction pad 81a from blowing off to surrounding.

Since the suction pad 81a is a porous body, the fluid ejected from the ejection part 721 is introduced into the voids V, so that a flow toward the suction part 722 from the lower sides of the foreign substances P may be formed. In this case, the foreign substances P may be more strongly removed from the suction pad 81a.

Each of the ejection port 723 of the ejection part 721 and the suction port 724 of the suction part 722 has a slit shape that extends in the movement direction of the removal unit 72 (see FIG. 2). The suction port 724 has an opening area (a slit width L1) greater than an opening area (a slit width L2) of the ejection port 723. Through such a configuration, it is possible to increase the flow velocity of the fluid ejected from the ejection port 723 and suppress the suction port 724 from being clogged with the foreign substances P. In addition, the flow rate of the fluid ejected from the ejection part 721 is equal to the flow rate of the fluid sucked into the suction part 722.

When a foreign substance P is assumed to have a maximum height of 300 μm, the slit width L1 of the suction port 724 is set to be about 2 mm, for example, and the slit width L2 of the ejection port 723 is set to be about 0.5 to 1 mm, for example. In addition, a distance L3 between the ejection port 723 and the suction port 724 is set to be about 1 mm, for example.

It is preferable that a gap G1 between each of the ejection port 723 and the suction port 724 and the suction pad 81a is greater than the assumed maximum height of the foreign substance P. When the maximum height of the foreign substance P is assumed to be 300 μm, the gap G1 is set to be about 300 μm to 2 mm, for example. In addition, a gap between the suction pad 81a and the detection unit 71 is set to be greater than the gap G1.

Although the ejection port 723 and the suction port 724 are depicted as having a slit shape in the drawings, they are not necessarily limited to having a slit shape. For example, the ejection port 723 and the suction port 724 may be configured of a plurality of successive holes. In this case, the hole formed as the suction port 724 preferably has a diameter greater than the maximum dimension of the foreign substance P.

Next, the configuration of the device connected to the removal unit 72 will be described with reference to FIG. 6.

Figure 6:
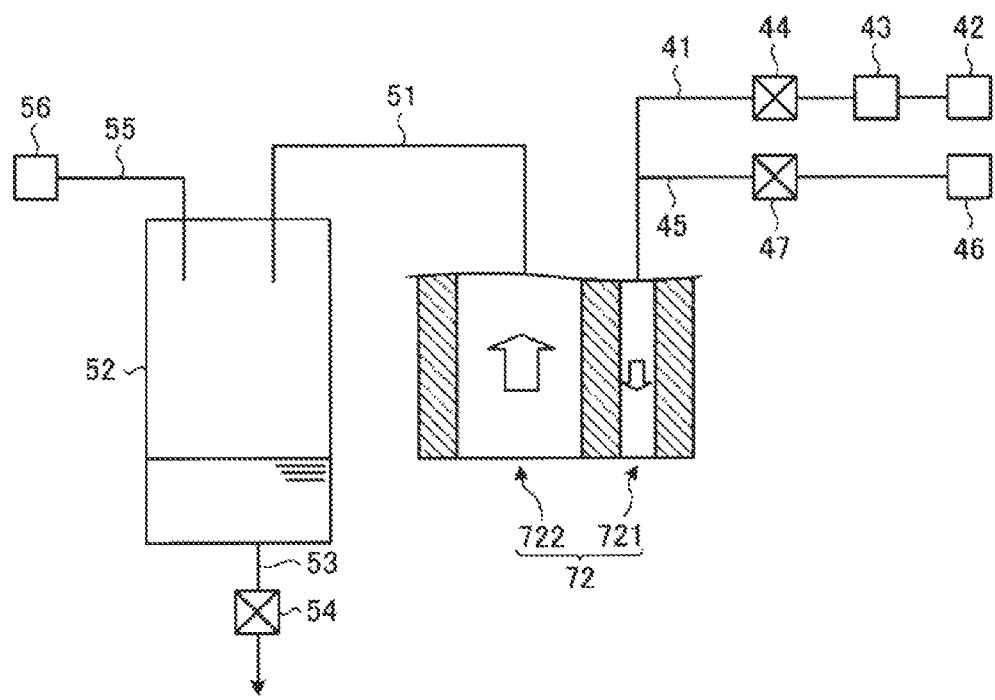
FIG. 6 is a view schematically illustrating a configuration of a device connected to the removal unit.

FIG. 6 is a view schematically illustrating the configuration of the device connected to the removal unit 72.

As illustrated in FIG. 6, the ejection part 721 is connected to a fluid supply pipe 41, and the fluid supply pipe 41 is connected to a gas supply source 42 for supplying gas such as dry air or $N_2$ gas, and a charge-neutralizing part 43 such as an ionizer which ionizes the gas supplied from the gas supply source 42. In addition, an on-off valve 44 and a flow regulation part (not shown) are installed on the fluid supply pipe 41.

A branch pipe 45 is connected to the middle portion of the fluid supply pipe 41. The branch pipe 45 is connected to a liquid supply source 46 for supplying liquid such as pure water, alcohol, or organic solvent (e.g., substrate-bonding adhesive such as P-menthane). In addition, an on-off valve 47 and a flow regulation part (not shown) are installed on the branch pipe 45.

As such, the ejection part 721 is connected to the gas supply source 42 and the liquid supply source 46. The control unit 61 controls the on-off valve 44 or 47 and the flow regulation part (not shown), so that the ejection part 721 may selectively eject gas or liquid to the suction pad 81a.

A solid foreign substance P having low adhesion may be sufficiently removed using gas. In addition, gas is ionized by the charge-neutralizing part 43, thereby enabling the removal efficiency of the charged foreign substance P to be improved.

Meanwhile, in a foreign substance P having high adhesion, liquid is preferably used. Since liquid has a higher specific gravity than gas, the removal capability associated with a lateral flow to the foreign substance P can be significantly increased. Particularly, in the suction pad 81a as a porous body, the liquid infiltrated into the suction pad 81a covers the lower surfaces of foreign substances P. Accordingly, since the suction force by the suction part 722 may be directly applied to the foreign substances P through the liquid, the removal capability of the foreign substances P can be improved. In addition, when high volatile liquid such as alcohol or IPA is used, the suction pad 81a may be immediately dried.

The suction part 722 is connected to a suction pipe 51, and the suction pipe 51 is connected to a trap tank 52. The trap tank 52 is connected to a discharge pipe 53, and an on-off valve 54 is installed on the discharge pipe 53. The trap tank 52 is connected to a suction pipe 55, and the suction pipe 55 is connected to a suction mechanism 56 such as a vacuum pump. Since the suction part 722 has the above configuration, the foreign substance P or the liquid sucked by the suction part 722 is collected in the trap tank 52 and is then discharged from the discharge pipe 53.

<Specific Operation of Foreign Substance Removal Apparatus>

Figure 7:
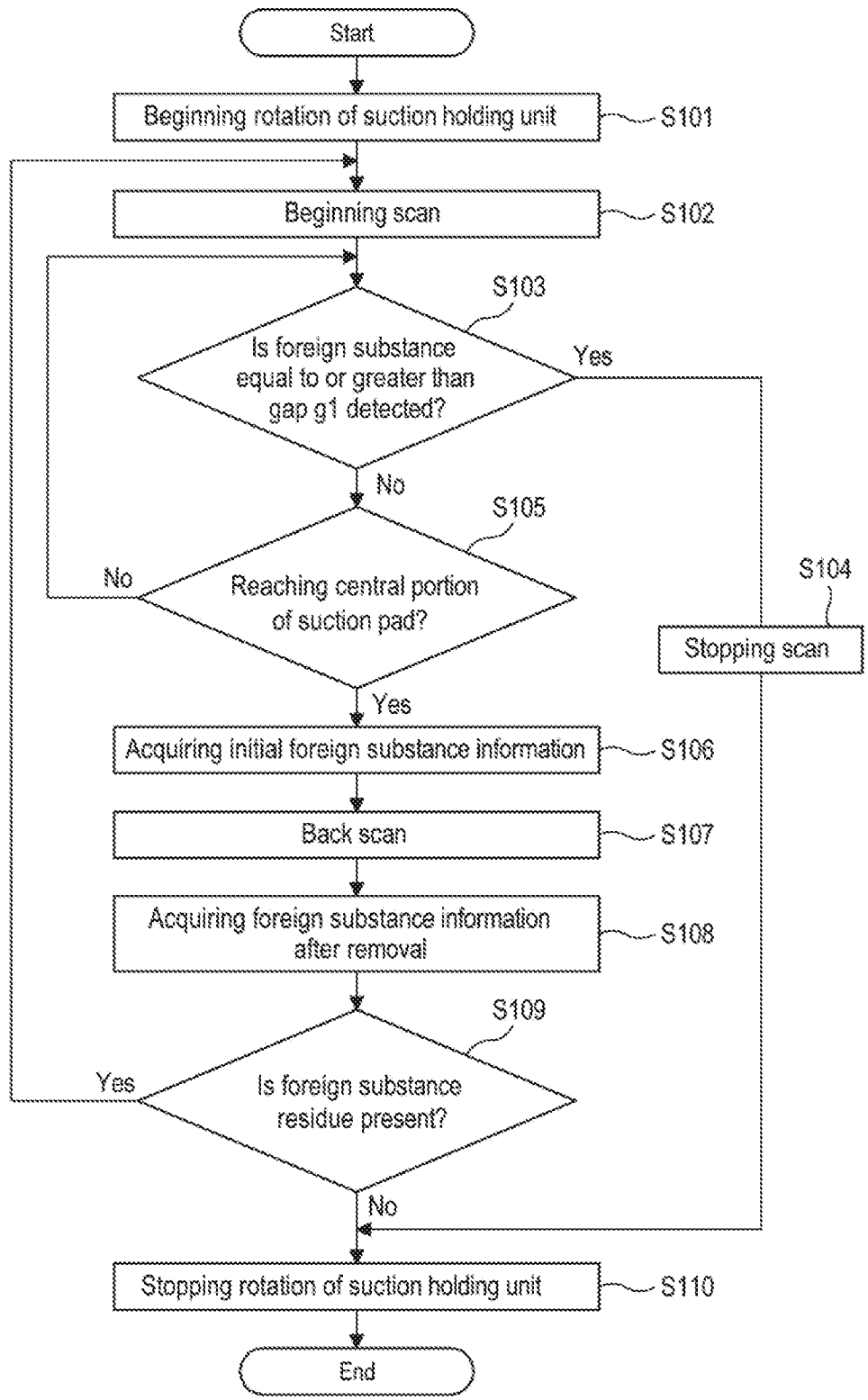
FIG. 7 is a flowchart illustrating processing procedures of a foreign substance removal process performed by the foreign substance removal apparatus.

Next, the specific operation of the foreign substance removal apparatus 70 will be described with reference to FIG. 7. FIG. 7 is a flowchart illustrating the processing procedures of the foreign substance removal process performed by the foreign substance removal apparatus 70. Each processing procedure illustrated in FIG. 7 is performed in such a manner that the control unit 61 controls the foreign substance removal apparatus 70 and the suction holding unit 80.

As illustrated in FIG. 7, the control unit 61 controls the rotary mechanism 83 of the suction holding unit 80 so as to rotate the body part 81 of the suction holding unit 80 (step S101). Next, the control unit 61 controls the rotary elevation mechanism 77 of the foreign substance removal apparatus 70 so as to locate the detection unit 71 and the removal unit 72 at the outer peripheral portion of the suction pad 81a. The control unit 61 controls the rotary elevation mechanism 77 to adjust the height of the support member 74 such that the distance from the suction pad 81a to the removal unit 72 is the gap G1 (see FIG. 5). The control unit 61 controls the movement mechanism 75 so as to begin the movement (scan) of the detection unit 71 and the removal unit 72 from the outer peripheral portion of the suction pad 81a to the central portion thereof (step S102). In addition, the detection unit 71 is disposed in front of the removal unit 72 in the scan direction in step S102.

As such, the detection and removal of foreign substances P may be performed on the whole surface of the suction pad 81a by rotating the body part 81 of the suction holding unit 80 and moving the detection unit 71 and the removal unit 72 toward the central portion of the suction pad 81a from the outer peripheral portion thereof. In addition, since the detection and removal of the foreign substances P are performed at the same time, it is possible to reduce a processing time required to detect and remove the foreign substances P.

As illustrated in FIG. 2, the removal unit 72 is provided such that the ejection part 721 and the suction part 722 are arranged in a direction perpendicular to the movement direction by the movement mechanism 75. The removal unit 72 is configured such that the suction part 722 is disposed more frontward than the ejection part 721 in the rotation direction of the suction pad 81a. Through such arrangement, the rotational force of the suction pad 81a is added to the force of flow toward the suction part 722 from the ejection part 721 (flow from top to bottom in FIG. 2). Therefore, by the synergy effect of such forces, the foreign substances P on the suction pad 81a can be more effectively removed. In addition, the processes in steps S101 and S012 may be simultaneously performed.

Next, the control unit 61 determines whether the detection unit 71 detects a foreign substance P having a dimension equal to or greater than the gap G1 (see FIG. 5) (step S103).

When the foreign substance P having a dimension equal to or greater than the gap G1 is determined to be detected ("Yes" in step S103), the control unit 61 controls the movement mechanism 75 to stop the scan of the detection unit 71 and the removal unit 72 (step S104). Accordingly, it is possible to prevent the removal unit 72 from colliding with the foreign substance P.

When the foreign substance P having a dimension equal to or greater than the gap G1 is determined to be detected, the control unit 61 may control the removal unit 72 to be lifted. Accordingly, the foreign substance P may be removed by the removal unit 72 while the removal unit 72 is prevented from colliding with the foreign substance P. In addition, the control unit 61 may generate an alarm.

Meanwhile, when the foreign substance P having a dimension equal to or greater than the gap G1 is not detected ("No" in step S103), the control unit 61 determines whether the detection unit 71 and the removal unit 72 reach the central portion of the suction pad 81a (step S105). In this case, when the detection unit 71 and the removal unit 72 do not reach the central portion of the suction pad 81a ("No" in step S105), the control unit 61 repeats the processes in steps S103 to S105 until the detection unit 71 and the removal unit 72 reach the central portion of the suction pad 81a.

When the detection unit 71 and the removal unit 72 are determined to reach the central portion of the suction pad 81a ("Yes" in step S105), the control unit 61 acquires the detection result of the foreign substance P, on the whole surface of the suction pad 81a detected by the detection unit 71, as "initial foreign substance information" (step S106), and stores the acquired initial foreign substance information in the memory unit 62.

Next, the control unit 61 controls the movement mechanism 75 so as to move (scan) the detection unit 71 and the removal unit 72 toward the outer peripheral portion of the suction pad 81a from the central portion thereof (step S107). As such, the foreign substance removal apparatus 70 move the detection unit 71 and the removal unit 72 between the outer peripheral portion and the central portion of the suction pad 81a, thereby performing the detection and removal of the foreign substance P in both of outward and return paths.

Here, when the control unit 61 controls the detection unit 71 and the removal unit 72 to move (scanned and back-scanned), the movement speeds of the detection unit 71 and the removal unit 72 may be changed according to positions on the suction pad 81a. Specifically, the control unit 61 controls the movement mechanism 75 such that the movement speeds of the detection unit 71 and the removal unit 72 in the central portion of the suction holding unit 80 are faster than those in the outer peripheral portion of the suction holding unit 80. Accordingly, the detection unit 71 and the removal unit 72 may detect and remove the foreign substance P per unit time in a uniform range, and thus a time required to remove the foreign substance P may be reduced.

The control unit 61 may control the movement speeds of the detection unit 71 and the removal unit 72 to be changed, based on the initial foreign substance information acquired in step S106. For example, the control unit 61 may control the movement speeds of the detection unit 71 and the removal unit 72 to be slow, in a region in which a large amount of foreign substances P are present on the suction pad 81a, based on the initial foreign substance information.

The detection unit 71 and the removal unit 72 are depicted as being reciprocated in the above description. However, after the detection unit 71 and the removal unit 72 are disposed on the central portion of the suction pad 81a, the control unit 61 may control them to move from the central portion of the suction pad 81a only to the outer peripheral portion thereof. In addition, the control unit 61 may control the detection unit 71 and the removal unit 72 to move from one end of the outer peripheral portion of the suction pad 81a to the other end thereof.

As describe above, each of the ejection port 723 of the ejection part 721 and the suction port 724 of the suction part 722 has a slit shape that extends in the movement direction of the removal unit 72 (see FIG. 2). Therefore, a time required for processing in steps S102 to S107 can be reduced.

Next, when the detection unit 71 and the removal unit 72 reach the outer peripheral portion of the suction pad 81a, the control unit 61 acquires the detection result of the foreign substance P, during the back-scan of the detection unit 71 and the removal unit 72, as "foreign substance information after removal" (step S108). The control unit 61 determines whether foreign substance residues are present based on the foreign substance information after removal (step S109). For example, when a foreign substance P having a predetermine dimension or more is present on the suction pad 81a, the foreign substance residues are determined to be present.

When the foreign substance residues are determined to be present ("Yes" in step S109), the control unit 61 returns the process to step S102, and repeats the processes in steps S102 to S109.

Here, when the foreign substance residues are determined to be present in step S109 while "gas" is ejected from the ejection part 721 and the first reciprocating is performed, the control unit 61 may control the second reciprocating to be performed while "liquid" is ejected from the ejection part 721. Consequently, foreign substances P, which are not removed when the first reciprocating is performed, can be perfectly removed by liquid having higher removal capability than gas.

In addition, when the detection unit 71 and the removal unit 72 are reciprocated, the control unit 61 may control such that the gas is ejected in the outward path and the liquid is ejected in the return path, toward the suction pad 81a from the ejection part 721. Consequently, foreign substances P, which are not removed in the outward path, can be perfectly removed by liquid having higher removal capability than gas.

Alternatively, the control unit 61 may control such that the liquid is ejected in the outward path and the gas is ejected in the return path, toward the suction pad 81a from the ejection part 721. As such, when the gas is supplied in the return path, the liquid supplied onto the suction pad 81a in the outward path may be dried early.

When the foreign substance residues are determined to be not present in step S109 ("No" in step S109), or the process in step S104 is terminated, the control unit 61 control the rotary mechanism 83 so as to stop the rotation of the body part 81 of the suction holding unit 80 (step S110), and terminates a series of foreign substance removal processes.

As describe above, the foreign substance removal apparatus 70 according to the first embodiment includes the detection unit 71, the removal unit 72, and the movement mechanism 75. The detection unit 71 detects the foreign substances P adhered to the surface of the suction pad 81a included in the suction holding unit 80. The removal unit 72 removes the foreign substances P adhered to the surface of the suction pad 81a using fluid. The movement mechanism 75 moves the detection unit 71 and the removal unit 72.

The removal unit 72 (corresponding to an example of "foreign substance removal apparatus") according to the first embodiment includes the ejection part 721 and the suction part 722. The ejection part 721 ejects fluid to the surface of the suction pad 81a included in the suction holding unit 80. The suction part 722 is disposed adjacent to the ejection part 721, and sucks fluid.

The detection unit 71 (corresponding to an example of "foreign substance detection apparatus") according to the first embodiment includes the light projecting part 711 and the light receiving part 712. The light projecting part 711 irradiates the surface of the suction pad 81a included in the suction holding unit 80 with light in the direction inclined thereto. The light receiving part 712 receives the reflection light of the light emitted to the suction pad 81a from the direction inclined to the suction pad 81a.

Accordingly, according to the foreign substance removal apparatus 70 according to the first embodiment, the foreign substances P adhered to the surface of the suction pad 81a can be detected and removed, and thus it is possible to prevent the substrate from being broken due to the foreign substances P thereon.

In addition, since the detection unit 71 and the removal unit 72 are moved while the body part 81 of the suction holding unit 80 is rotated in the foreign substance removal apparatus 70 according to the first embodiment, the detection and removal of the foreign substances P can be performed on the whole surface of the suction pad 81a for a short time.

Second Embodiment

Figure 8:
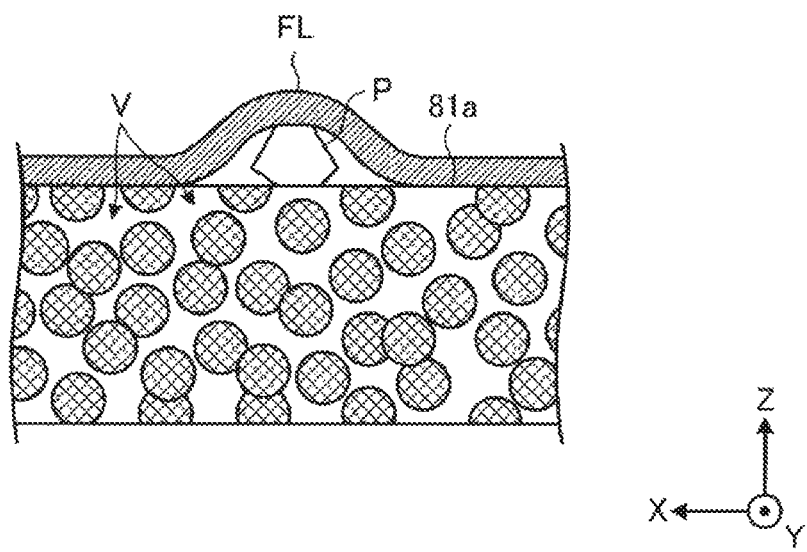
FIG. 8 is a view for explaining a foreign substance detection method according to a second embodiment.

Next, a foreign substance detection method according to a second embodiment will be described with reference to FIG. 8. FIG. 8 is a view for explaining the foreign substance detection method according to the second embodiment.

As illustrated in FIG. 8, after a film FL is loaded on the suction pad 81a and the film FL is held on the suction pad 81a in the foreign substance detection apparatus 70, the foreign substance detection apparatus 70 may perform the foreign substance removal process illustrated in FIG. 7.

It is possible to suppress the light from being diffusely reflected due to voids V by covering the suction pad 81a as a porous body using the film FL.

In addition, the upper surface of the film FL presents a gentle curved surface where an amorphous foreign substance is present. Thereby, since a region for high reflection of light emitted at an angle by the light projecting part 711 is increased, it is possible to improve the contrast of captured images and increase the detection accuracy of foreign substances P.

The film FL may have a thickness or a modulus of elasticity selected according to the sizes of foreign substances P intended to be detected. For example, when a foreign substance P has a size smaller than a void V of the suction pad 81a and is buried in the void V so as not to affect the substrate, the bulge of the film FL due to the foreign substance P may be made nearly zero by setting the film FL to have a predetermined thickness or more or to have a predetermined modulus of elasticity or more. Thus, the foreign substance P, which does not affect the substrate, may be excluded from detection targets by the detection unit 71.

For example, a resin film is preferably used as the film FL. The resin film is preferably made of a material that prevents metal contamination and obtains a uniform thickness for the film with less dust thereon. For example, a material such as a dicing tape or a back grind tape may be selected.

In addition, a high reflection coating is preferably applied to the film FL. When the film FL to which the high reflection coating is applied is used, the contrast of captured images may be further improved. In addition, as the film FL, a film whose surface is coated with a metal film such as Si, Al, or W may be used. It is preferable that the metal film be extensible so as not to be cracked due to the deformation of the film FL, and has high adhesivity.

In addition, a metal thin film, such as an AL foil, an Si single crystal film, etc. may be used as the film FL. They are effective in detecting finer foreign substances P (e.g., equal to or less than 10 μm).

The film FL is preferably adhered to a dicing frame. Thereby, the film FL may be easily transported using a substrate transport device. In this case, the film FL is preferably stored, for example, in a device for accommodating the suction holding unit 80.

When the film FL is used, the detection accuracy of foreign substances P can be improved since the boundary between the surface of the suction pad 81a, on which a foreign substance P is not present, and the surface of the suction pad 81a, on which a foreign substance P is present, is distinctly displayed, even though the suction pad 81a is vertically irradiated with the light.

Figure 9:
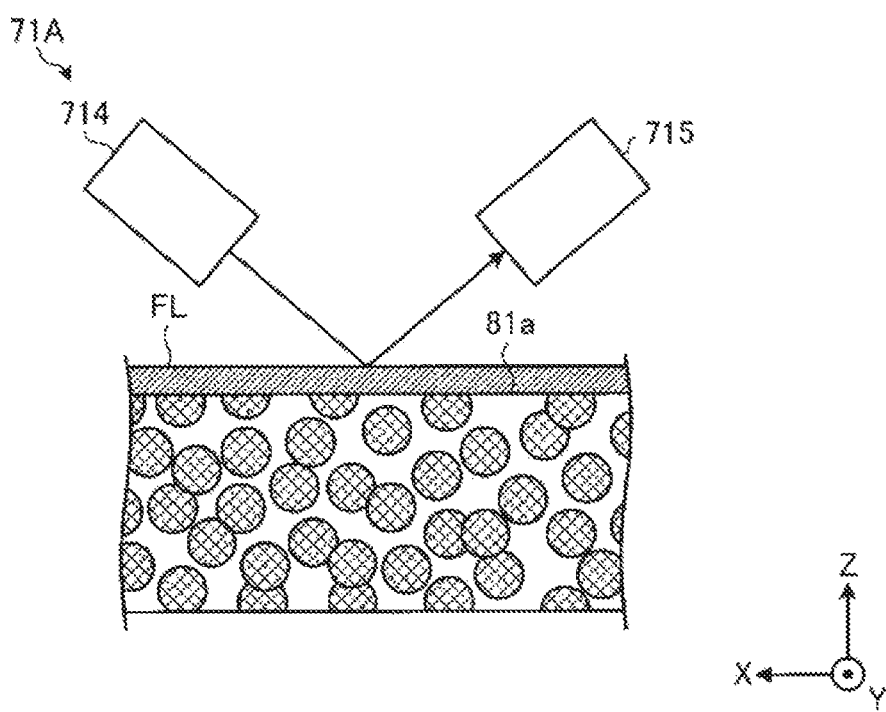
FIG. 9 is a view for explaining a modification example of a foreign substance detection processing according to the second embodiment.
Figure 10:
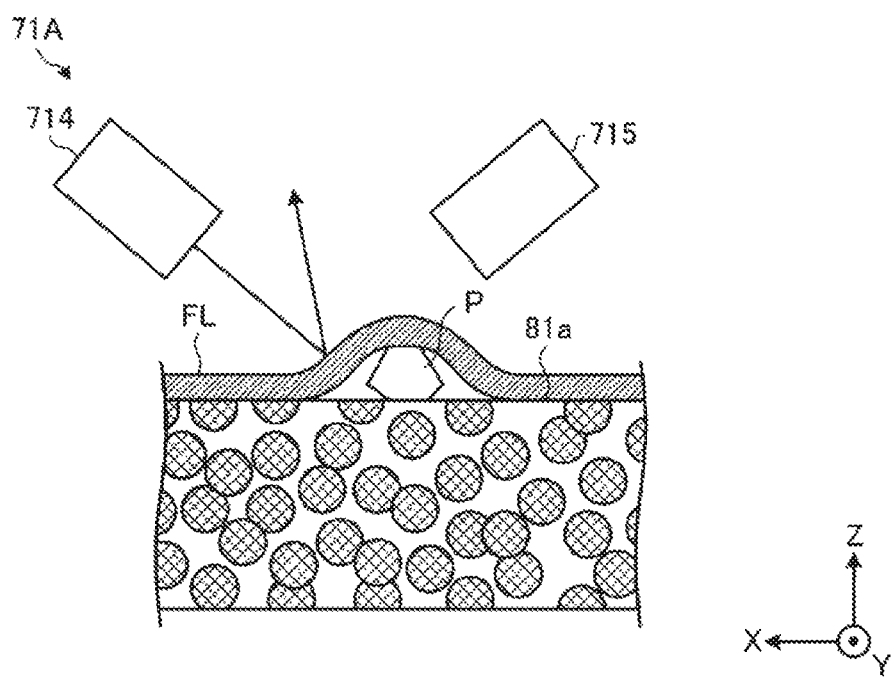
FIG. 10 is a view for explaining a modification example of a foreign substance detection processing according to the second embodiment.

Next, a modification example of the foreign substance detection processing using the above film FL will be described with reference to FIGS. 9 and 10. FIGS. 9 and 10 are views for explaining a modification example of the foreign substance detection processing according to the second embodiment.

As illustrated in FIG. 9, a detection unit 71A includes a light projecting part 714 and a light receiving part 715. The light projecting part 714 irradiates the film FL of the suction pad 81a with light in a direction inclined thereto. The light receiving part 715 receives the reflection light of the light emitted to the film FL from a direction inclined thereto.

In addition, the light receiving part 715 is positioned such that, when a foreign substance P is assumed to be not present within a range in which the film FL is irradiated with light, the light receiving part 715 can receive the light reflected from the film FL (see FIG. 9), and such that, when a predetermined foreign substance P is assumed to be present within a range in which the film FL is irradiated with light, the light receiving part 715 cannot receive the light reflected from the film FL (see FIG. 10). By arranging the light receiving part 715 at the above position, foreign substances P can be detected.

Third Embodiment

Figure 11:
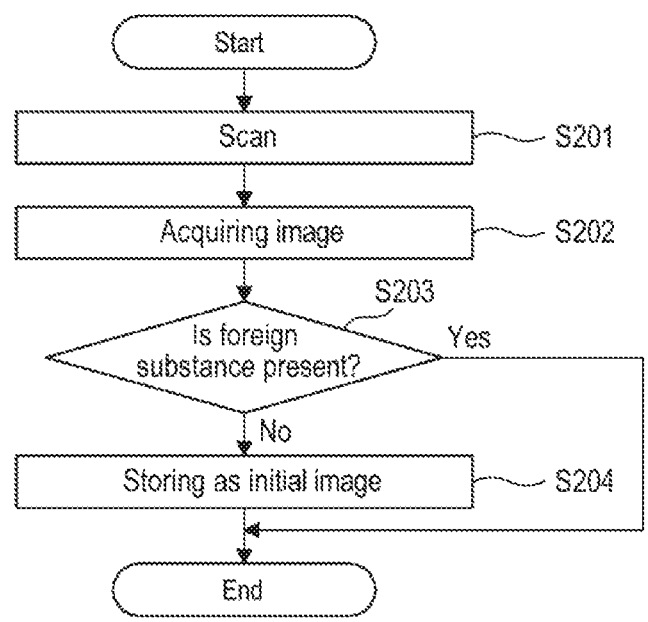
FIG. 11 is a flowchart illustrating processing procedures of an initial image acquisition process.
Figure 12:
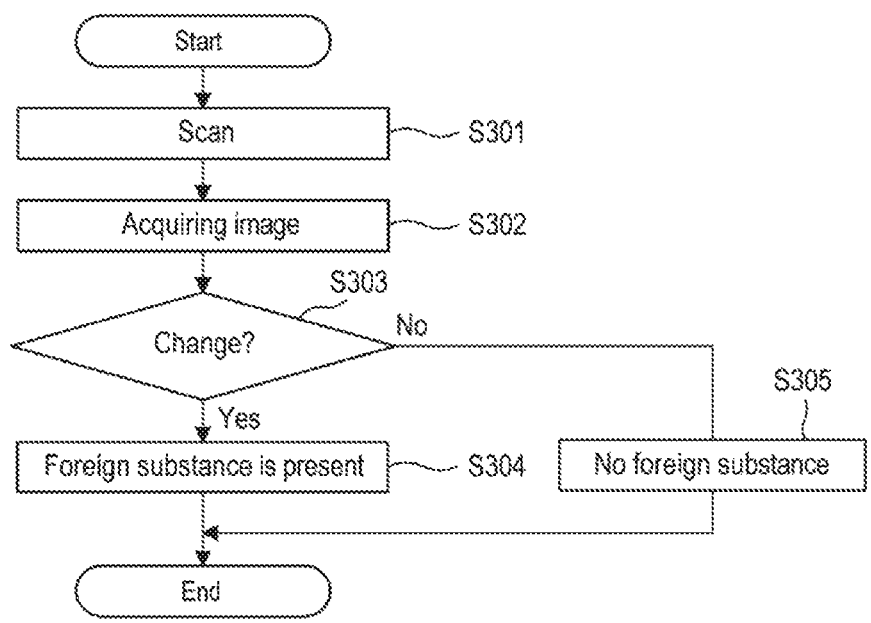
FIG. 12 is a flowchart illustrating processing procedures of a foreign substance detection process according to a modification example.

Next, a foreign substance detection method according to a third embodiment will be described with reference to FIGS. 11 and 12. FIG. 11 is a flowchart illustrating processing procedures of an initial image acquisition process. FIG. 12 is a flowchart illustrating processing procedures of a foreign substance detection process according to a modification example.

As illustrated in FIG. 11, first, the control unit 61 controls the detection unit 71 to scan the whole surface of the suction pad 81a on which no foreign substance P is present, and acquires information about the porous structure or surface roughness of the suction pad 81a as an initial image.

Specifically, as illustrated in FIG. 11, the control unit 61 controls the detection unit 71 to scan the whole surface of the suction pad 81a (step S201), and acquires a captured image (step S202). Next, the control unit 61 determines whether a foreign substance P is present on the suction pad 81a, based on the acquired image (step S203). When the foreign substance P is determined to be not present ("No" in step S203), the captured image acquired in step S202 is stored as an initial image in the memory unit 62 by the control unit 61 (step S204).

When the foreign substance P is determined to be present ("Yes" in step S203), the captured image is not stored by the control unit 61. In this case, for example, after the foreign substance P on the suction pad 81a is removed by the removal unit 72, the control unit 61 may perform the processes in steps S201 to S204 again.

Next, the control unit 61 performs the foreign detection processing using the initial image acquired by the initial image acquisition process. Specifically, the control unit 61 controls the detection unit 71 to scan the whole surface of the suction pad 81a (step S301), and acquires a captured image (step S302). Next, the control unit 61 determines whether a change between the captured image acquired in step S302 and the initial image is present, based on a difference between the captured image acquired in step S302 and the initial image acquired by the initial image acquisition process (step S303).

When the captured image is determined to be changed from the initial image ("Yes" in step S303), the control unit 61 determines that a foreign substance P is present on the suction pad 81a (step S304). When the captured image is determined to be not changed from the initial image ("No" in step S303), the control unit 61 determines that no foreign substance P is present on the suction pad 81a (step S305).

As such, since the noise caused due to the porous structure or surface roughness of the suction pad 81a is removed by comparing the captured image acquired in step S302 with the initial image, any foreign substances P can be very accurately detected.

In addition, it is preferable that the initial image acquisition process illustrated in FIG. 11 is regularly performed. Since the surface shape of the suction pad 81a is changed with time, the initial image acquisition process is regularly performed to update the initial image. Consequently, the foreign substance detection processing can be stably performed.

In the initial image acquisition process, a film FL may be used. For example, after the film FL is held on the suction pad 81a, the detection unit 71 is controlled to scan in order to determine whether a foreign substance P is present based on the captured image acquired by the detection unit 71. When the foreign substance P is determined to be not present, the film FL is removed and the detection unit 71 scans again. In this case, the captured image acquired by the detection unit 71 may be stored as an initial image in the memory unit 62.

Fourth Embodiment

Figure 13:
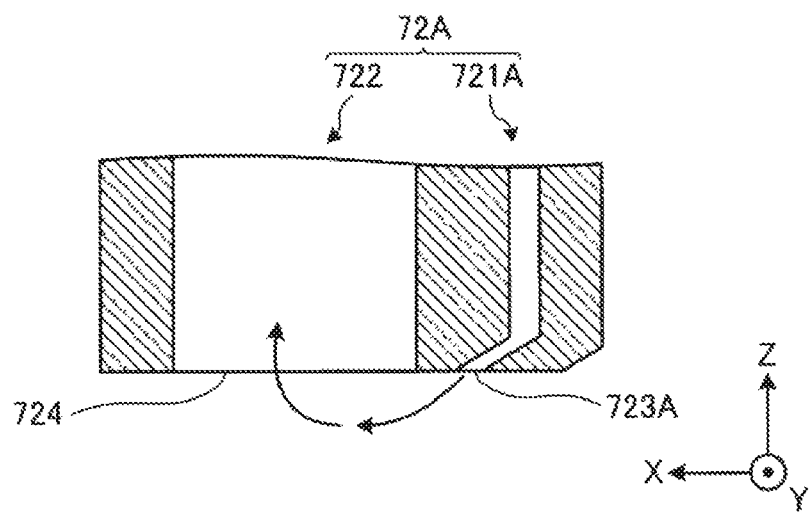
FIG. 13 is a cross-sectional view schematically illustrating a configuration of a removal unit according to a fourth embodiment.

Next, the configuration of a removal unit according to a fourth embodiment will be described with reference to FIG. 13. FIG. 13 is a cross-sectional view schematically illustrating the configuration of the removal unit according to the fourth embodiment.

As illustrated in FIG. 13, the removal unit, which is designated by reference numeral 72A, according to the fourth embodiment includes an ejection part 721A and a suction part 722. The suction part 722 has the same configuration as that in the above first embodiment.

The ejection part 721A according to the fourth embodiment ejects fluid in a direction inclined to the suction pad 81a and biased to the suction part 722.

As such, since an ejection port 723A of the ejection part 721A is inclined toward a suction port 724 of the suction part 722, the velocity of the fluid may be increased between the ejection part 721A and the suction part 722. Therefore, the removal efficiency of foreign substances P can be improved. In addition, it is possible to reduce the fluid leaking to the opposite side of the suction part 722 from the ejection part 721A, and thus foreign substances P can be suppressed from being left and moving upwards.

Fifth Embodiment

Figure 14:
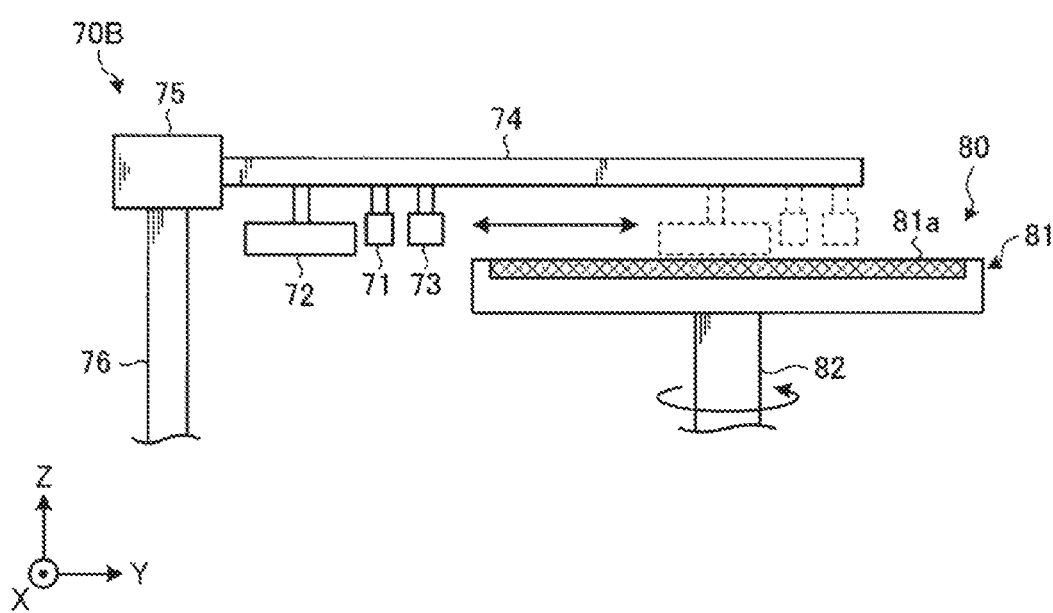
FIG. 14 is a side view schematically illustrating a configuration of a foreign substance removal apparatus according to a fifth embodiment.
Figure 15:
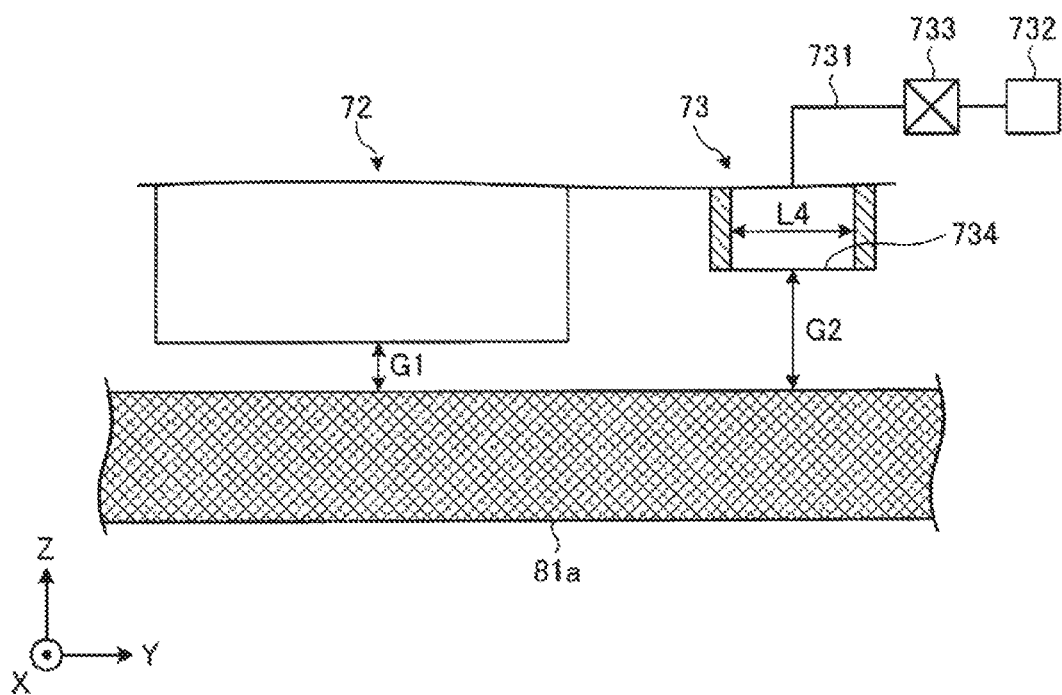
FIG. 15 is a cross-sectional view schematically illustrating a configuration of a pre-suction part.

Next, a foreign substance removal apparatus 70B according to a fifth embodiment will be described with reference to FIGS. 14 and 15. FIG. 14 is a side view schematically illustrating the configuration of the foreign substance removal apparatus according to the fifth embodiment. FIG. 15 is a cross-sectional view schematically illustrating the configuration of a pre-suction part.

As illustrated in FIG. 14, the foreign substance removal apparatus 70B according to the fifth embodiment further includes a pre-suction part 73. The pre-suction part 73 sucks the fluid, similarly to the suction part 722 included in the removal unit 72. The pre-suction part 73 is disposed more frontward than the detection unit 71 and the removal unit 72, in the advancing direction thereof in an outward path while the detection unit 71, the removal unit 72, and the pre-suction part 73 are reciprocated by the movement mechanism 75.

As illustrated in FIG. 15, the pre-suction part 73 is connected to a suction pipe 731, and the suction pipe 731 is connected to a suction mechanism 732 such as a vacuum pump. In addition, an on-off valve 44 and a flow regulation part are installed in the suction pipe 731.

A suction port 734 included in the pre-suction part 73 is installed at a position further spaced from the suction pad 81a, compared to the ejection port 723 and suction port 724 included in the respective ejection part 721 and suction part 722 of the removal unit 72. That is, a gap G2 between the suction pad 81a and the pre-suction part 73 is set to be larger than the gap G1 between the suction pad 81a and the removal unit 72. In addition, the suction port 734 of the pre-suction part 73 has a greater opening diameter L4 than the slit width L1 of the suction port 724 of the suction part 722.

Consequently, even when, for example, a foreign substance P having a size exceeding the gap G1 is present, the foreign substance removal apparatus 70B according to the fifth embodiment can prevent the removal unit 72 from colliding with the foreign substance P by previously removing the foreign substance P having such an unexpected size using the pre-suction part 73.

Sixth Embodiment

Figure 16:
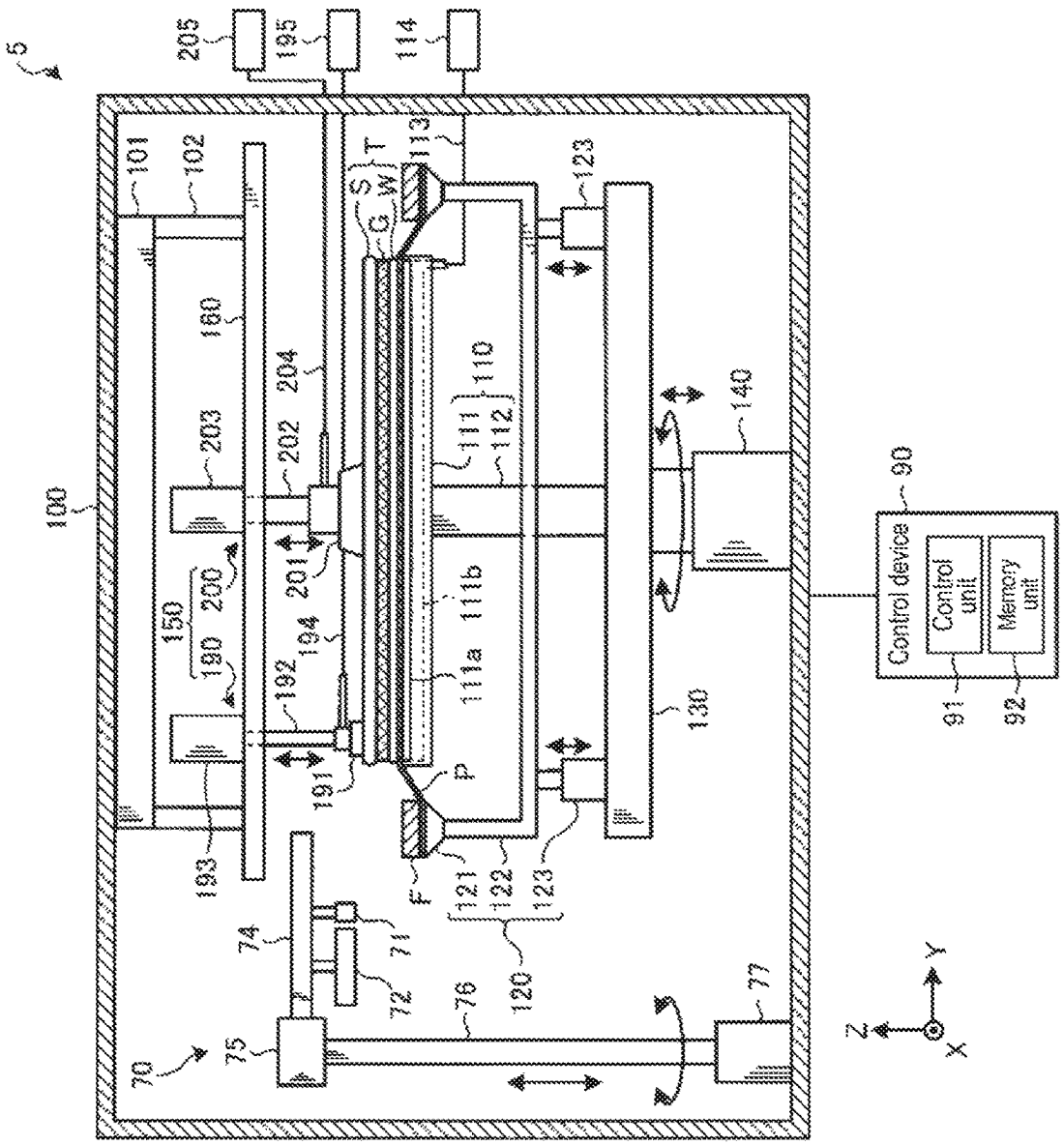
FIG. 16 is a top view schematically illustrating a configuration of a separation apparatus according to a sixth embodiment.
Figure 17:
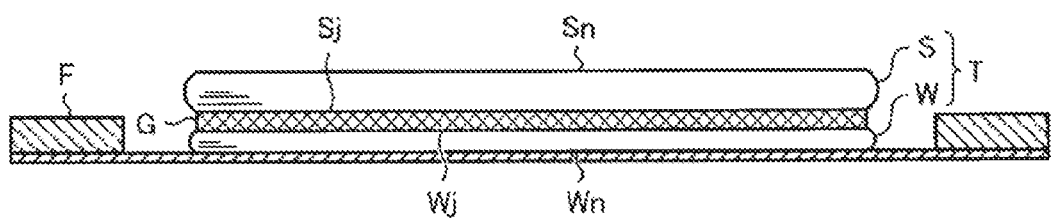
FIG. 17 is a side view schematically illustrating an overlapped substrate held on a dicing frame.

Next, the configuration of a separation apparatus including the above foreign substance removal apparatus will be described with reference to FIGS. 16 and 17. FIG. 16 is a top view schematically illustrating the configuration of a separation apparatus according to a sixth embodiment. FIG. 17 is a side view schematically illustrating an overlapped substrate held on a dicing frame. Here, there is provided an example in which the separation apparatus includes the foreign substance removal apparatus 70 according to the first embodiment.

As illustrated in FIG. 16, the foreign substance removal apparatus 70 is installed in the separation apparatus 5. The separation apparatus 5 separates an overlapped substrate T (see FIG. 17), in which a substrate to be processed W is bonded to a support substrate S using an adhesive G, into the substrate to be processed W and the support substrate S.

Hereinafter, the surface of the substrate to be processed W, which is bonded to the support substrate S through the adhesive G, is referred to as a "bonding surface Wj", and the opposite surface of the bonding surface Wj is referred to as a "non-bonding surface Wn", as illustrated in FIG. 17. In addition, the surface of the support substrate S, which is bonded to the substrate to be processed W through the adhesive G, is referred to as a "bonding surface Sj", and the opposite surface of the bonding surface Sj is referred to as a "non-bonding surface Sn".

For example, the substrate to be processed W is a substrate in which a plurality of electronic circuits are formed on a semiconductor substrate such as a silicon wafer or a compound semiconductor wafer, and the surface of the substrate on which the electronic circuits are formed is referred to as a bonding surface Wj. In addition, the non-bonding surface Wn of the substrate to be processed W is, for example, ground so that the substrate to be processed W has a thin structure. Specifically, the substrate to be processed W has a thickness of about 20 to 200 µm.

Meanwhile, the support substrate S is a substrate having the substantially same diameter as the substrate to be processed W, and supports the substrate to be processed W. The support substrate S has a thickness of about 650 to 750 µm. As such a support substrate S, a silicon wafer, a glass substrate, etc., may be used. In addition, the adhesive G used to bond the substrate to be processed W and the support substrate S has a thickness of about 40 to 150 µm.

Since the substrate to be processed W is very thin, and is easily damaged, it is protected by a dicing frame F. The dicing frame F is a substantially rectangular member having an opening portion which is formed at the center thereof and has a larger diameter than the overlapped substrate T. As illustrated in FIG. 17, the overlapped substrate T is held by the dicing frame F in the state in which the substrate to be processed W is located below and the support substrate S is located above.

As illustrated in FIG. 16, the separation apparatus 5 includes a processing unit 100. The processing unit 100 has a carrying-in/out port (not shown) formed at the side thereof. Through the carrying-in/out port, the overlapped substrate T is transported into the processing unit 100, or the substrate to be processed W and the support substrate S after separation are transported from the processing unit 100.

The separation apparatus 5 includes a first holding unit 110, a frame holding unit 120, a lower base part 130, a rotary elevation mechanism 140, a second holding unit 150, and an upper base part 160. They are disposed within the processing unit 100.

The first holding unit 110 is a suction holding unit such as a porous chuck, similarly the above suction holding unit 80. The first holding unit 110 sucks and holds the substrate to be processed W constituting the overlapped substrate T through a dicing tape installed in the opening portion of the dicing frame F.

The first holding unit 110 includes a disk-shaped body part 111, and a post member 112 which supports the body part 111. The post member 112 is supported by the lower base part 130.

The body part 111 is made of, e.g., metal such as aluminum. A suction pad 111a is installed on the upper surface of the body part 111. The suction pad 111a has a diameter equal to or slightly greater than the overlapped substrate T, and substantially comes into contact with the lower surface of the overlapped substrate T, i.e., the whole surface of the non-bonding substrate Wn of the substrate to be processed W.

The body part 111 has a suction space 111b which is defined therein to communicate with the outside through the suction part 111a. The suction space 111b is connected to an intake device 114, such as a vacuum pump, through an intake pipe 113.

The first holding unit 110 sucks the non-bonding substrate Wn of the substrate to be processed W to the suction pad 111a through the dicing tape, using negative pressure generated by in-taking the air in the intake device 114. Thus, the first holding unit 110 holds the substrate to be processed W. In addition, although the first holding unit 110 is depicted as being a porous chuck herein, the first holding unit may be, e.g., an electrostatic chuck.

The frame holding unit 120 for holding the dicing frame F from below is disposed outside the first holding unit 110. The frame holding unit 120 includes a plurality of suction pads 121 for sucking and holding the dicing frame F, a support member 122 for supporting the suction pads 121, and a movement mechanism 123 fixed to the lower base part 130 so as to vertically move the support member 122.

The lower base part 130 is disposed beneath the first holding unit 110 and the frame holding unit 120, and supports the first holding unit 110 and the frame holding unit 120. The lower base part 130 is supported by the rotary elevation mechanism 140 fixed to the bottom of the processing unit 100.

The rotary elevation mechanism 140 rotates the lower base part 130 around the vertical axis thereof. Accordingly, the first holding unit 110 and the frame holding unit 120 supported by the lower base part 130 rotate integrally. In addition, the rotary elevation mechanism 140 vertically moves the lower base part 130. Accordingly, the first holding unit 110 and the frame holding unit 120 supported by the lower base part 130 are integrally lifted or lowered.

The second holding unit 150 is disposed above and faces the first holding unit 110. The second holding unit 150 includes a first suction movement part 190 and a second suction movement part 200. The first and second suction movement parts 190 and 200 are supported by the upper base part 160. The upper base part 160 is supported through a post 102 by a fixing member 101 installed to the ceiling portion of the processing unit 100.

The first suction movement part 190 sucks and holds the peripheral portion of the support substrate S. In addition, the second suction movement part 200 sucks and holds a region which is closer to the central portion of the support substrate S than the peripheral portion thereof. The respective first and second suction movement parts 190 and 200 independently move the sucked-held regions in a direction spaced apart from the surface of the substrate to be processed W.

The first suction movement part 190 includes a first suction pad 191, a post member 192, and a movement mechanism 193. The second suction movement part 200 includes a second suction pad 201, a post member 202, and a movement mechanism 203.

The first and second suction pads 191 and 201 have intake ports (not shown), the respective intake ports are connected to intake devices 195 and 205, such as vacuum pumps, through intake pipes 194 and 204.

The post members 192 and 202 support the first and second suction pads 191 and 201 at the tips thereof, respectively. The base ends of the post members 192 and 202 are supported by the movement mechanisms 193 and 203, respectively. The movement mechanisms 193 and 203 are fixed to the upper portion of the upper base part 160, and vertically move the post members 192 and 202.

The first and second suction movement parts 190 and 200 suck the support substrate S using negative pressure generated by in-taking the air in the intake devices 195 and 205. Thus, the first and second suction movement parts 190 and 200 hold the support substrate S. In addition, the first suction pad 191 included in the first suction movement part 190 sucks the peripheral portion of the support substrate S, and the second suction pad 201 included in the second suction movement part 200 sucks the central portion of the support substrate S.

The first and second suction movement parts 190 and 200 vertically move the post members 192 and 202 and the first and second suction pads 191 and 201 by the respective movement mechanisms 193 and 203, in the state in which the support substrate S is held. Thus, the first and second suction movement parts 190 and 200 vertically move the support substrate S.

The separation apparatus 5 includes a control device 90. The control device 90 is a device for controlling the operation of the separation apparatus 5. The control device 90 is, e.g., a PC, and includes a control unit 91 and a memory unit 92. The memory unit 92 is implemented, for example, by semiconductor memory devices such as RAMs and flash memories. The memory unit 92 stores programs for controlling various types of processing such as a separation processing. The control unit 91 is, e.g., a CPU, and controls the operation of the separation apparatus 5 by reading and executing the programs stored in the memory unit 92.

The separation apparatus 5 sequentially moves the first and second suction movement parts 190 and 200 of the second holding unit 150 in an upward direction so as to pull the support substrate S in a direction spaced apart from the substrate to be processed W, in the state in which the substrate to be processed W is sucked and held by the first holding unit 110, the dicing frame F is sucked and held by the frame holding unit 120, and the support substrate S is held by the second holding unit 150. Consequently, the support substrate S is continuously separated from the substrate to be processed W toward the central portion of the support substrate S from the peripheral portion thereof.

In addition, before the separation apparatus 5 moves the first and second suction movement parts 190 and 200, a portion at which the support substrate S begins to be separated from the substrate to be processed W, may be formed at the side of the overlapped substrate T by sharp member (not shown).

The separation apparatus 5 includes the foreign substance removal apparatus 70. The foreign substance removal apparatus 70 is disposed laterally from the first holding unit 110 in the processing unit 100. The foreign substance removal apparatus 70 detects and removes foreign substances P which are present on the suction pad 111*a* of the first holding unit 110. The substrate to be processed W held by the first holding unit 110 of the separation apparatus 5 is thin. For this reason, when a foreign substance P is present on the first holding unit 110, defects such as breakage of the substrate to be processed W may be caused. In contrast, since the separation apparatus 5 detects and removes foreign substances P, which are present on the suction pad 111*a* of the first holding unit 110, using the foreign substance removal apparatus 70, it is possible to prevent the substrate to be processed W from being damaged.

In the above-mentioned first to sixth embodiments, the case where the holding surface of the suction holding unit 80 or the first holding unit 110 is oriented upward, and the detection unit 71 or the removal unit 72 is disposed above the holding surface has been illustratively described. However, the holding surface of the suction holding unit 80 or the first holding unit 110 may be oriented downward, and the detection unit 71 or the removal unit 72 may be disposed beneath the holding surface.

Seventh Embodiment

Figure 18:
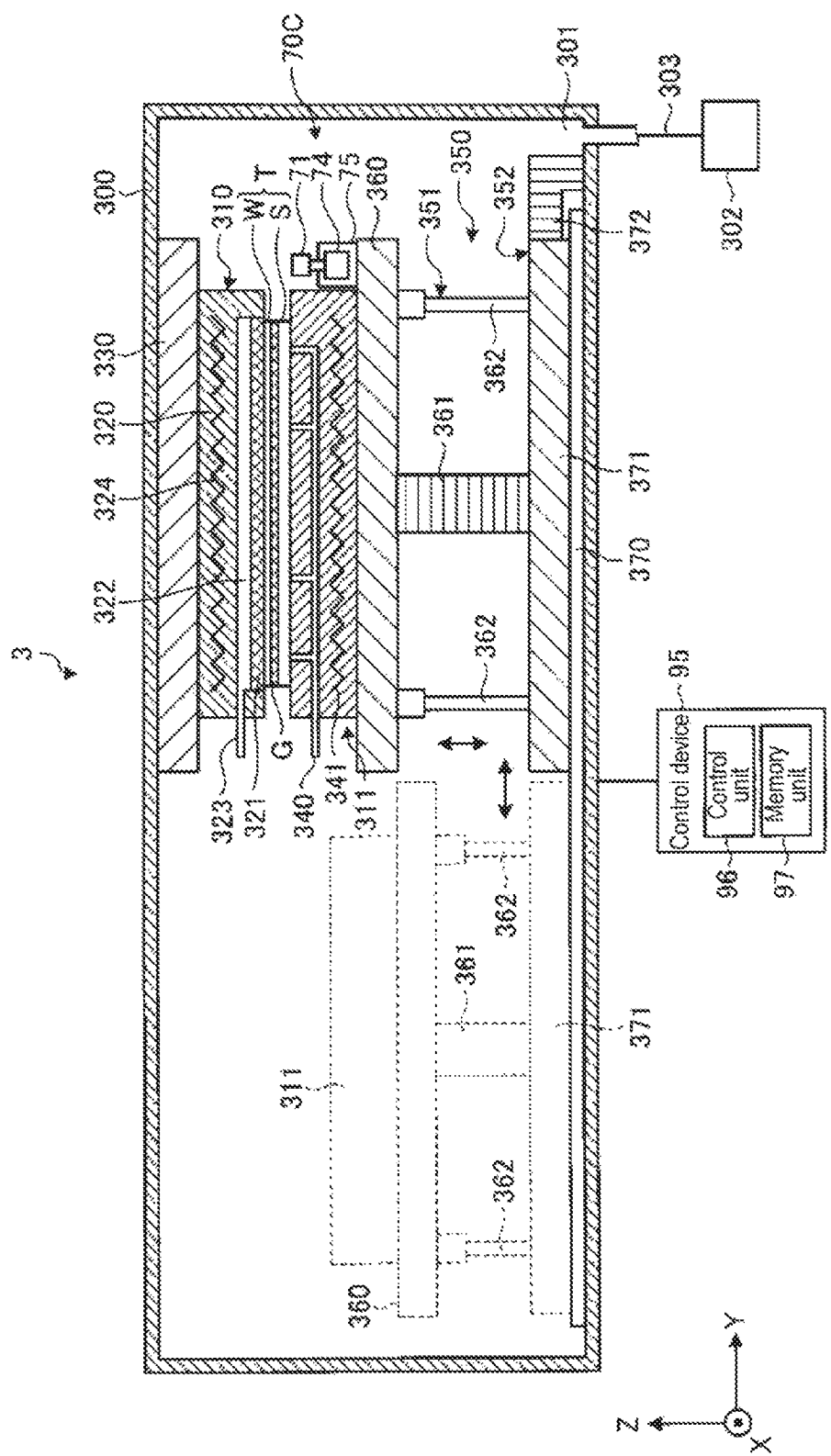
FIG. 18 is a side view schematically illustrating a configuration of a separation apparatus according to a seventh embodiment.
Figure 19:
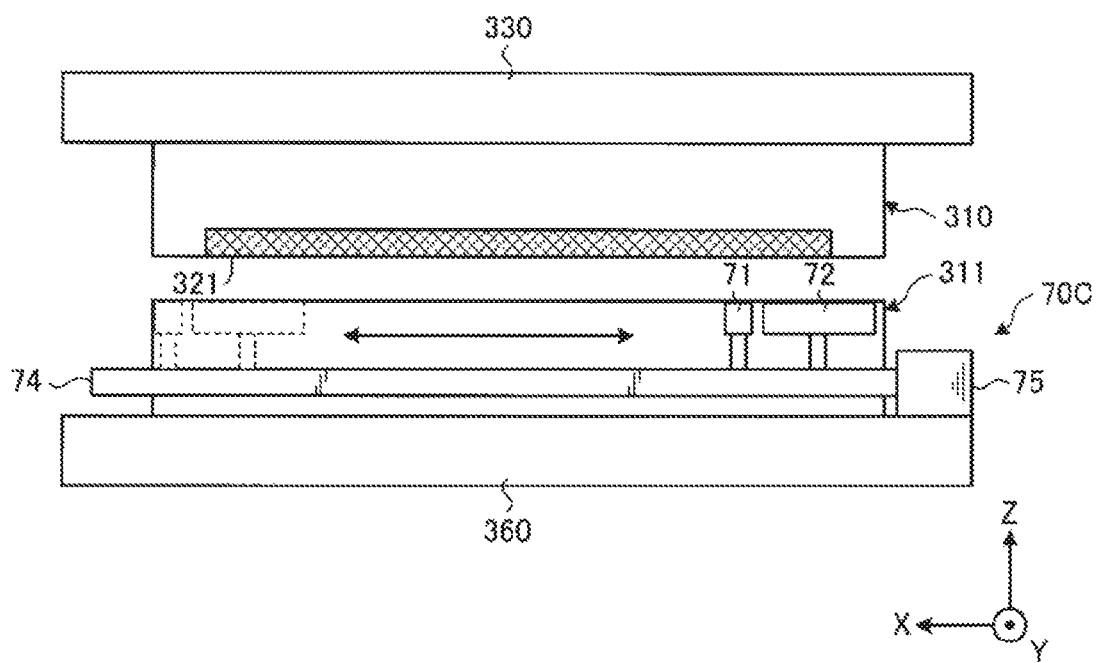
FIG. 19 is a side view schematically illustrating the configuration of the separation apparatus according to the seventh embodiment.

Next, the configuration of another separation apparatus including a foreign substance removal apparatus will be described with reference to FIGS. 18 and 19. FIGS. 18 and 19 are side views schematically illustrating the configuration of a separation apparatus according to a seventh embodiment.

As illustrated in FIG. 18, the separation apparatus, which is designated by reference numeral 3, according to the seventh embodiment includes therein a housing 300 for accommodating a plurality of devices. The housing 300 has carrying-in/out ports (not shown), and an on-off shutter (not shown) is installed at each of the carrying-in/out ports.

The housing 300 has an exhaust port 301 formed at the bottom thereof for discharging the atmosphere therein. The exhaust port 301 is connected to an exhaust pipe 303 which communicates with an exhaust device 302 such as a vacuum pump. By discharging the atmosphere in the housing 300 from the exhaust port 301, an airflow, which is oriented downward and is referred to as a down flow, is formed in the housing 300.

A first holding unit 310 for sucking and holding a substrate to be processed W at the lower surface thereof, and a second holding unit 311 for holding a support substrate S in the state of loading the same at the upper surface thereof are installed in the housing 300. The first holding unit 310 is installed above the second holding unit 311, and is disposed so as to face the second holding unit 311. That is, an overlapped substrate T is separated, in the state in which the substrate to be processed W is located above and the support substrate S is located below, in the housing 300.

Similarly to the above suction holding unit 80, the first holding unit 310 is a suction holding unit such as a porous chuck. The first holding unit 310 has a flat body part 320. A suction pad 321 is installed on the lower surface of the body part 320. For example, the suction pad 321*a* has the substantially same diameter as the substrate to be processed W, and comes into contact with the non-bonding substrate Wn of the substrate to be processed W.

The body part 320 has a suction space 322 which is defined therein and located above the suction pad 321. For example, the suction space 322 is formed so as to cover the suction pad 321. The suction space 322 is connected to a suction pipe 323. The suction pipe 323 is connected to a negative pressure generation device (not shown) such as a vacuum pump. The non-bonding substrate Wn of the substrate to be processed W is sucked from the suction pipe 323 through the suction space 322 and the suction pad 321, so that the substrate to be processed W is sucked and held by the first holding unit 310.

In addition, a heating mechanism 324 for heating the substrate to be processed W is installed above the suction space 322 in the body part 320. The heating mechanism 324 is, e.g., a heater.

A support plate 330 for supporting the first holding unit 310 is installed at the upper surface of the first holding unit 310. The support plate 330 is supported by the ceiling surface of the housing 300. In addition, the first holding unit 310 may be supported, while coming into contact with the ceiling surface of the housing 300.

A suction pipe 340 for sucking and holding the support substrate S is installed in the second holding unit 311. The suction pipe 340 is connected to a negative pressure generation device (not shown) such as a vacuum pump.

In addition, a heating mechanism 341 for heating the support substrate S is installed in the second holding unit 311. The heating mechanism 341 is, e.g., a heater.

A movement mechanism 350, which moves the second holding unit 311 and the support substrate S in vertical and horizontal directions, is installed beneath the second holding unit 311. The movement mechanism 350 includes a vertical movement part 351 which vertically moves the second holding unit 311, and a horizontal movement part 352 which horizontally moves the second holding unit 311.

The vertical movement part 351 includes a support plate 360 for supporting the lower surface of the second holding unit 311, a drive portion 361 for lifting or lowering the support plate 360, and a support member 362 for supporting the support plate 360. For example, the drive portion 361 has a ball screw (not shown) and a motor (not shown) for rotating the ball screw. In addition, the support member 362 is configured to be vertically extendable, and is installed, for example, at three places, between the support plate 360 and a support body 371 to be described below.

The horizontal movement part 352 includes a rail 370 extending horizontally, a support body 371 installed at the rail 370, and a drive portion 372 which moves the support body 371 along the rail 370. For example, the drive portion 372 has a ball screw (not shown) and a motor (not shown) for rotating the ball screw.

In addition, an elevation pin (not shown), which supports the overlapped substrate T or the support substrate S at the lower side thereof and lifts or lowers the same, is installed beneath the second holding unit 311. The elevation pin is inserted into a through-hole (not shown) formed in the second holding unit 311, and may protrude from the upper surface of the second holding unit 311.

The separation apparatus 3 has the above configuration, and shifts the overlapped substrate T along the bonding surfaces of the substrate to be processed W and the support substrate S while heating the overlapped substrate T. As a result, the overlapped substrate T is separated into the substrate to be processed W and the support substrate S.

Specifically, the overlapped substrate T transported into the separation apparatus 3 is sucked and held by the second holding unit 311. Then, the second holding unit 311 is lifted by the movement mechanism 350, and the overlapped substrate T is interposed and held between the first and second holding units 310 and 311. In this case, the non-bonding surface Wn of the substrate to be processed W is sucked and held by the first holding unit 310, and the non-bonding surface Sn of the support substrate S is sucked and held by the second holding unit 311.

Thereinafter, the overlapped substrate T is heated at a predetermined temperature, e.g., at a temperature of 200 degrees C. by the heating mechanisms 324 and 341. Then, an adhesive G in the overlapped substrate T is softened.

Subsequently, while the adhesive G is maintained in the softened state by heating the overlapped substrate T using the heating mechanisms 324 and 341, the second holding unit 311 and the support substrate S are moved in the vertical and horizontal directions, i.e., obliquely downward, by the movement mechanism 350. Then, the substrate to be processed W held by the first holding unit 310 and the support substrate S held by the second holding unit 311 are separated from the overlapped substrate T.

The separation apparatus 3 includes a control device 95. The control device 95 is a device for controlling the operation of the separation apparatus 3. The control device 95 is, e.g., a PC, and includes a control unit 96 and a memory unit 97. The memory unit 97 is implemented, for example, by semiconductor memory devices such as RAMs and flash memories. The memory unit 97 stores programs for controlling various types of processing such as a separation processing. The control unit 96 is, e.g., a CPU, and controls the operation of the separation apparatus 3 by reading and executing the programs stored in the memory unit 97.

The foreign substance removal apparatus, which is designated by reference numeral 70C, according to the seventh embodiment is installed, for example, at the upper portion of the support plate 360. As illustrated in FIG. 19, the foreign substance removal apparatus 70C includes a detection unit 71, a removal unit 72, a support member 74, and a movement mechanism 75. The movement mechanism 75 is installed on the support plate 360. The support member 74 extends in a direction (X-axis direction) perpendicular to the movement direction (Y-axis direction) by the horizontal movement part 352. The detection unit 71 and the removal unit 72 are supported from below by the support member 74.

Figure 20:
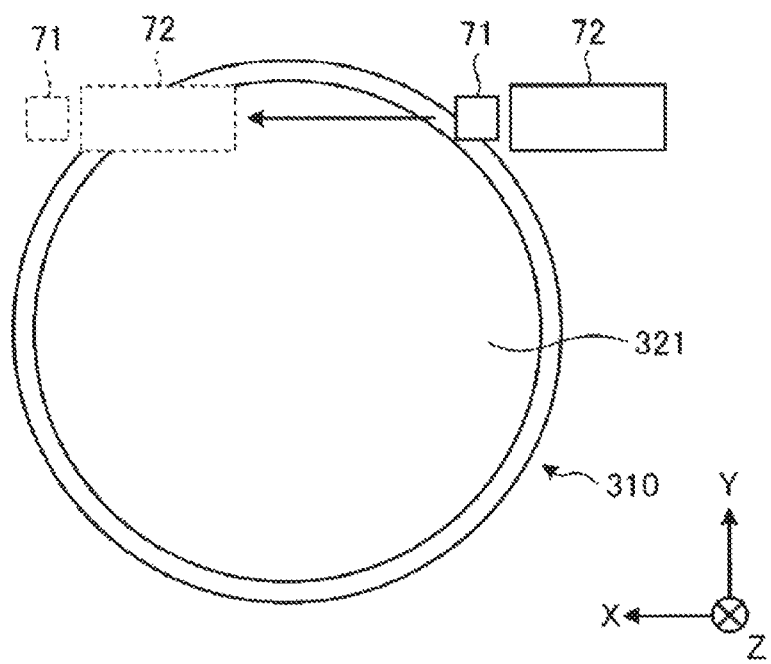
FIG. 20 is a view illustrating an example operation of a foreign substance detection processing according to the seventh embodiment.
Figure 21:
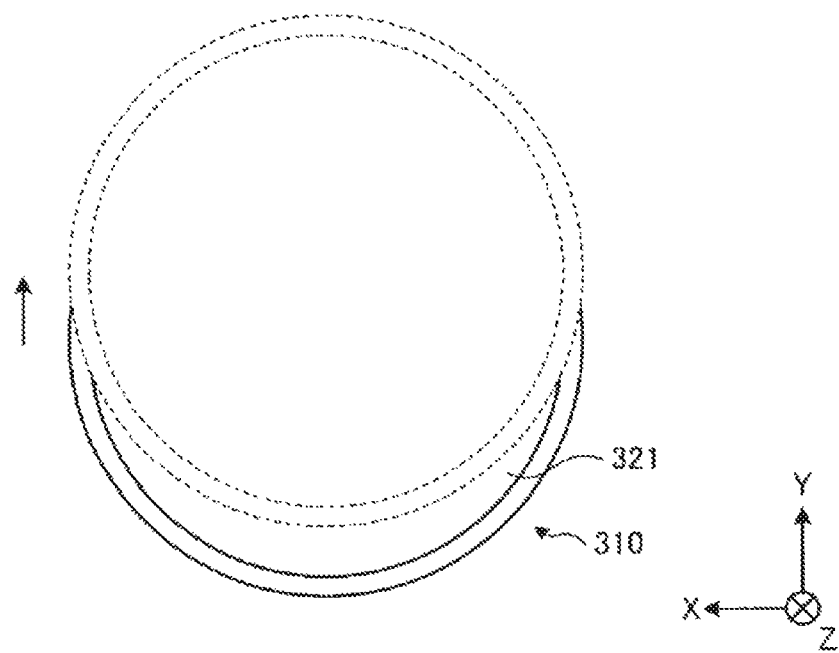
FIG. 21 is a view illustrating an example operation of a foreign substance detection processing according to the seventh embodiment.
Figure 22:
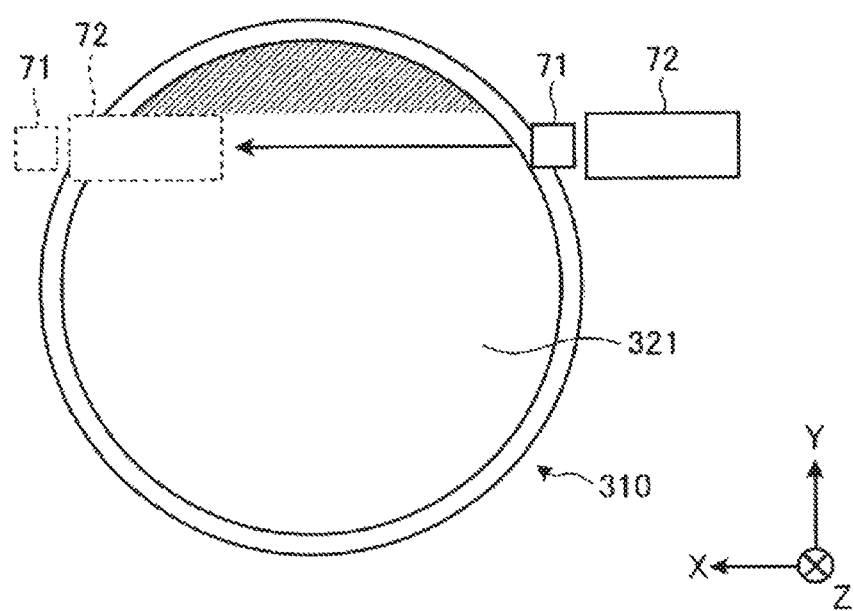
FIG. 22 is a view illustrating an example operation of a foreign substance detection processing according to the seventh embodiment.

Next, the foreign substance detection processing using the foreign substance removal apparatus 70C according to the seventh embodiment will be described with reference to FIGS. 20 to 22. FIGS. 20 to 22 are views illustrating an example operation of the foreign substance detection processing according to the seventh embodiment. FIGS. 20 to 22 schematically illustrate the first holding unit 310 when viewed from below.

As illustrated in FIGS. 20 to 22, the control unit 96 controls the detection unit 71 and the removal unit 72 to scan the whole surface of the suction pad 321 using the horizontal movement part 352 and the movement mechanism 75.

First, the control unit 96 controls the vertical movement part 351 to adjust the height of the support plate 360, such that the distance from the suction pad 321 to the removal unit 72 is a predetermined gap. Subsequently, as illustrated in FIG. 20, after the detection unit 71 and the removal unit 72 are located at the outer peripheral portion of the suction pad 321, the control unit 96 controls the movement mechanism 75 so that the detection unit 71 and the removal unit 72 are moved in a direction perpendicular to the movement direction by the horizontal movement part 352. Consequently, the detection and removal of foreign substances P are performed on a portion of the suction pad 321.

Subsequently, the control unit 96 controls the horizontal movement part 352 such that the suction pad 321 is moved by a predetermined distance in the positive Y-axis direction, as illustrated in FIG. 21. As illustrated in FIG. 22, the control unit 96 controls the movement mechanism 75 such that the detection unit 71 and the removal unit 72 are moved again in the direction perpendicular to the movement direction by the horizontal movement part 352. The control unit 96 repeats the above process, thereby enabling the detection and removal of foreign substances P to be performed on the whole surface of the suction pad 321.

As such, a foreign substance detection apparatus may be installed in the separation apparatus 3 or 5 which separates the overlapped substrate T, configured by the bonding of the substrate to be processed W and the support substrate S, into the substrate to be processed W and the support substrate S.

Other Embodiments

In each of the above-mentioned embodiments, the case where the detection unit 71 and the removal unit 72 are moved by the movement mechanism 75 has been illustratively described. However, the present disclosure is not limited thereto. For example, when each of the detection unit 71 and the removal unit 72 is set to have a length equal to or greater than the diameter of the suction pad 81a or 111a, the detection and removal of foreign substances P can be performed on the whole surface of the suction pad 81a or 111a by rotating the suction pad 81a or 111a by the rotary mechanism 83 or the rotary elevation mechanism 140, instead of moving the detection unit 71 and the removal unit 72.

Although the case where the foreign substance removal apparatus is installed in the separation apparatus has been illustratively described in the above-mentioned sixth and seventh embodiments, the foreign substance removal apparatus may be installed in various types of semiconductor devices including suction units such as porous chucks or electrostatic chucks, in addition to being installed in the separation apparatus. For example, the foreign substance removal apparatus may be installed in a cleaning apparatus for cleaning a semiconductor substrate, a mounter for mounting a dicing frame on a semiconductor substrate, an inspection apparatus for inspecting the surface of a semiconductor substrate, a dicing apparatus for cutting a semiconductor substrate into chip units, etc.

According to the present disclosure in some embodiments, foreign substances adhered to the holding surface of a suction holding unit can be removed.

According to the present disclosure in some embodiments, foreign substances adhered to the holding surface of a suction holding unit can be detected.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An apparatus for removing at least one foreign substance, comprising:
   a detection unit detecting the at least one foreign substance adhered to a rotatable holding surface of a suction holding unit configured to suck and hold a substrate, the suction holding unit having a suction space communicating with an outer portion;
   a removal unit removing the at least one foreign substance adhered to the holding surface using fluid;
   a movement mechanism being rotatably supported and configured to move the detection unit and the removal unit; and
   a control unit configured to control the detection unit, the removal unit and the movement mechanism,
   wherein the movement mechanism causes the detection unit and the removal unit to be moved in a reciprocating path between an outer peripheral portion of the suction holding unit and a central portion of the suction holding unit,
   wherein the detection unit is disposed frontward in an advancing direction in an outward path of the reciprocating path, and the removal unit is disposed rearward in the advancing direction, so that the detection and the removal of the foreign substance can be performed at the same time, and
   wherein the control unit determines whether a residue after removal of the at least one foreign substance is present, based on a result detected by the detection unit in a return path of the reciprocating path.

2. The apparatus of claim 1, wherein:
   the removal unit comprises an ejection part that selectively ejects one of gas and liquid to the holding surface; and
   the control unit controls movement in the reciprocating path to be performed for a first time while the gas is ejected from the ejection part, and controls movement in the reciprocating path to be performed for a second time while the liquid is ejected from the ejection part when the residue after removal of the at least one foreign substance is determined to be present during movement in the reciprocating path.

3. The apparatus of claim 1, wherein, when a foreign substance having a height exceeding a distance from the holding surface to the removal unit is detected by the detection unit in the outward path of the reciprocating path, the control unit stops movement of the detection unit and the removal unit by the movement mechanism.

4. The apparatus of claim 1, wherein the movement mechanism allows movement speeds of the detection unit and the removal unit in the central portion of the suction holding unit to be faster than those in the outer peripheral portion of the suction holding unit.

* * * * *